US012575427B2

(12) United States Patent
Ecton et al.

(10) Patent No.: US 12,575,427 B2
(45) Date of Patent: Mar. 10, 2026

(54) DEFECT-FREE THROUGH GLASS VIA METALLIZATION IMPLEMENTING A SACRIFICIAL RESIST THINNING MATERIAL

(71) Applicant: Intel Corporation, Santa Clara, CA (US)

(72) Inventors: Jeremy D Ecton, Gilbert, AZ (US); Darko Grujicic, Chandler, AZ (US); Suddhasattwa Nad, Chandler, AZ (US); Benjamin Duong, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 963 days.

(21) Appl. No.: 17/474,277

(22) Filed: Sep. 14, 2021

(65) Prior Publication Data

US 2023/0083425 A1     Mar. 16, 2023

(51) Int. Cl.
| | |
|---|---|
| *H01L 23/498* | (2006.01) |
| *H01L 23/15* | (2006.01) |
| *H01L 25/065* | (2023.01) |
| *H10W 70/05* | (2026.01) |
| *H10W 70/63* | (2026.01) |

(Continued)

(52) U.S. Cl.
CPC ....... *H10W 70/095* (2026.01); *H10W 70/635* (2026.01); *H10W 70/66* (2026.01); *H10W 70/692* (2026.01); *H10W 90/00* (2026.01)

(58) Field of Classification Search
CPC . H01L 21/486; H01L 23/49827; H01L 23/15; H01L 23/49866; H01L 25/0655; H01L 2223/6616; H01L 23/66; H01L 23/49816; H01L 23/5383; H01L 23/5385
See application file for complete search history.

(56) References Cited

U.S. PATENT DOCUMENTS

| | | | | |
|---|---|---|---|---|
| 10,917,966 | B2 * | 2/2021 | Jayaraman | ........... H05K 1/0306 |
| 11,152,294 | B2 * | 10/2021 | Huang | ................. H05K 1/0306 |

(Continued)

FOREIGN PATENT DOCUMENTS

| | | | | |
|---|---|---|---|---|
| CN | 107123605 A | * | 9/2017 | ............. H01L 24/97 |
| CN | 110867429 | | 3/2020 | |

(Continued)

OTHER PUBLICATIONS

"International Application Serial No. PCT US2022 073989, International Search Report mailed Nov. 14, 2022", 3 pgs.

(Continued)

*Primary Examiner* — Earl N Taylor
(74) *Attorney, Agent, or Firm* — Essential Patents Group, LLP

(57) ABSTRACT

An electronic device comprises an electronic package with a glass core. The glass core includes a first surface and a second surface opposite the first surface, at least one through-glass via (TGV) extending through the glass core from the first surface to the second surface and including an electrically conductive material, and wherein the at least one TGV includes a first portion having a first sidewall and a second portion that includes a second sidewall, wherein the first sidewall includes seed metallization and the second sidewall excludes the seed metallization.

12 Claims, 7 Drawing Sheets

(51) Int. Cl.

| | |
|---|---|
| *H01L 21/48* | (2006.01) |
| *H10W 70/66* | (2026.01) |
| *H10W 70/692* | (2026.01) |
| *H10W 90/00* | (2026.01) |

(56) References Cited

U.S. PATENT DOCUMENTS

| | | | | |
|---|---|---|---|---|
| 12,004,295 | B2 * | 6/2024 | Jayaraman | H05K 1/09 |
| 12,131,985 | B2 * | 10/2024 | Kanungo | H05K 1/0271 |
| 2007/0045779 | A1 * | 3/2007 | Hiatt | H01L 24/05 |
| | | | | 257/E21.597 |
| 2012/0217648 | A1 * | 8/2012 | Park | B81C 1/00301 |
| | | | | 257/E21.585 |
| 2013/0062210 | A1 * | 3/2013 | Fushie | H05K 3/423 |
| | | | | 205/125 |
| 2013/0313121 | A1 * | 11/2013 | Yu | H01L 23/49827 |
| | | | | 205/122 |
| 2015/0250058 | A1 * | 9/2015 | Ramachandran | H01L 25/065 |
| | | | | 361/748 |
| 2016/0111380 | A1 * | 4/2016 | Sundaram | H01L 23/49822 |
| | | | | 438/126 |
| 2016/0336179 | A1 * | 11/2016 | Mizutani | C23C 18/1651 |
| 2017/0047313 | A1 * | 2/2017 | Yang | H01L 23/49811 |
| 2017/0287728 | A1 * | 10/2017 | Dahlberg | H01L 21/2885 |
| 2018/0205002 | A1 * | 7/2018 | Bak | H10N 50/01 |
| 2019/0096741 | A1 * | 3/2019 | Uzoh | H01L 21/76856 |
| 2019/0239353 | A1 * | 8/2019 | Jayaraman | H05K 3/388 |
| 2019/0304912 | A1 * | 10/2019 | Ecton | H01L 23/5386 |
| 2019/0313524 | A1 * | 10/2019 | Huang | H05K 3/388 |
| 2020/0165160 | A1 * | 5/2020 | Kanungo | H01L 23/49838 |
| 2020/0251424 | A1 * | 8/2020 | Mazumder | H01L 21/486 |
| 2021/0043464 | A1 * | 2/2021 | Nolet | H01L 23/49827 |
| 2021/0407896 | A1 * | 12/2021 | Kanungo | C03C 17/06 |
| 2022/0189880 | A1 * | 6/2022 | Pietambaram | H01L 25/50 |
| 2023/0082385 | A1 * | 3/2023 | Ecton | H01L 21/486 |
| | | | | 257/774 |

FOREIGN PATENT DOCUMENTS

| | | | | | |
|---|---|---|---|---|---|
| DE | 102014119308 | A1 * | 7/2015 | | H01L 23/5384 |
| JP | 2020102593 | A * | 7/2020 | | H01L 21/4857 |
| TW | 201712812 | A | 4/2017 | | |
| TW | 201939671 | A | 10/2019 | | |
| TW | 202100484 | A | 1/2021 | | |
| WO | WO-2020163067 | A1 * | 8/2020 | | H01L 23/15 |

OTHER PUBLICATIONS

"International Application Serial No. PCT US2022 073989, Written Opinion mailed Nov. 14, 2022", 4 pgs.

International Preliminary Report on Patentability from PCT/US2022/073989 notified Mar. 28, 2024, 6 pgs.

Office Action from Taiwanese Patent Application No. 111129571 notified Dec. 9, 2025, 19 pgs.

* cited by examiner

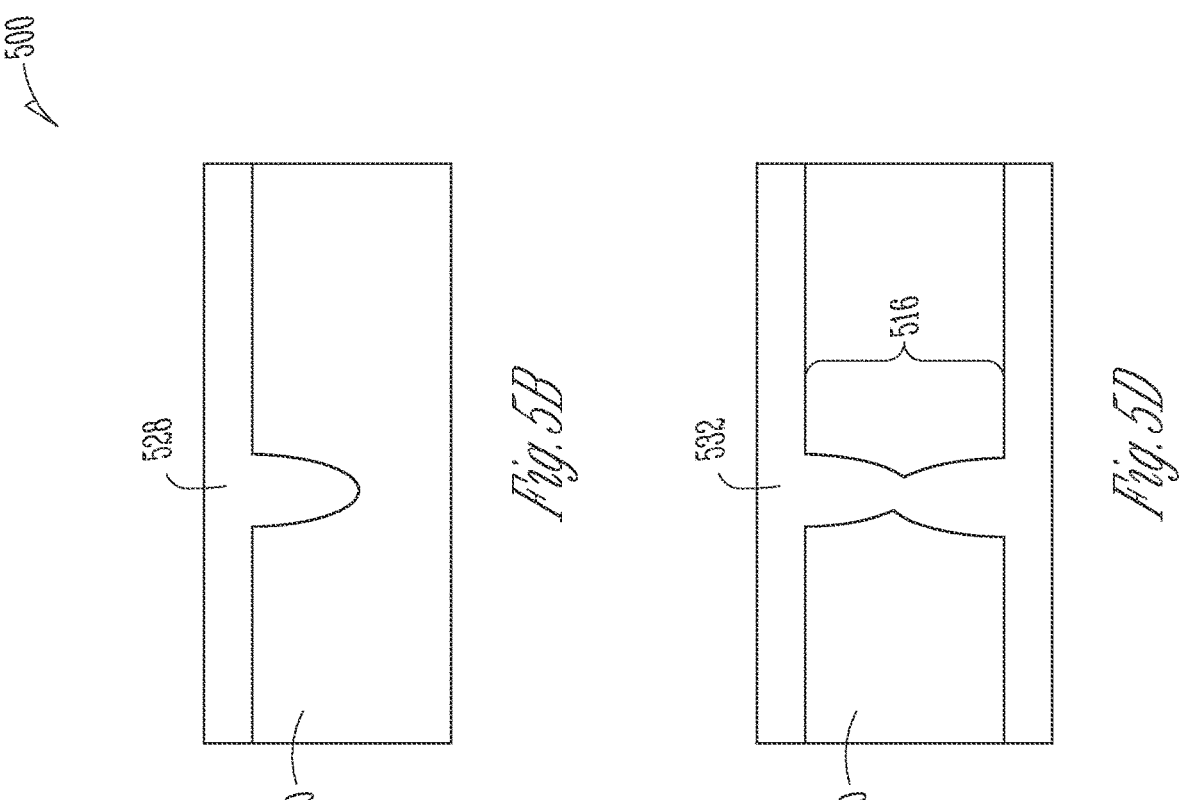
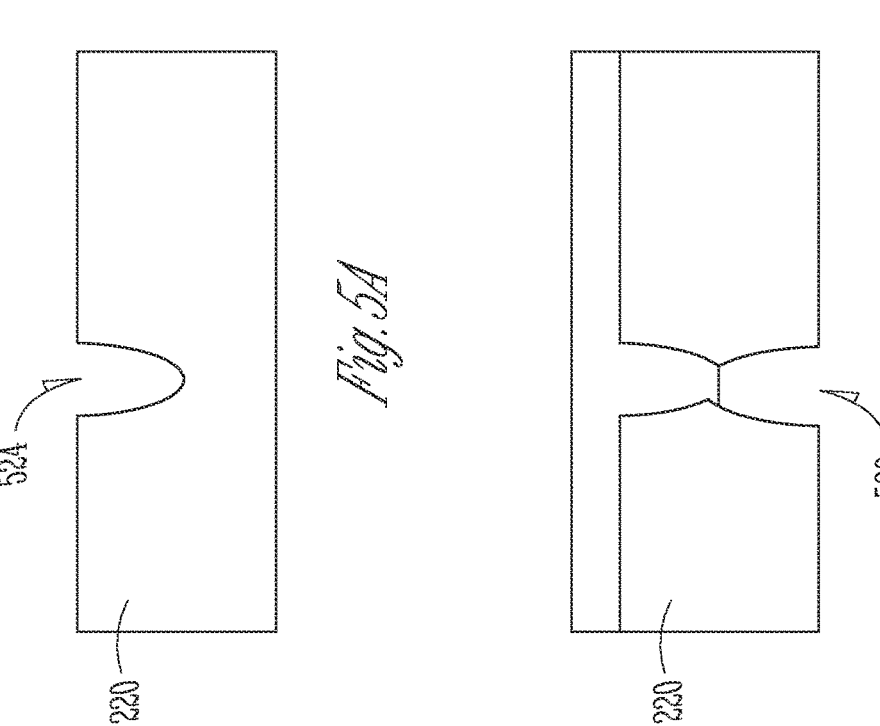

DEFECT-FREE THROUGH GLASS VIA METALLIZATION IMPLEMENTING A SACRIFICIAL RESIST THINNING MATERIAL

TECHNICAL FIELD

Embodiments pertain to packaging of integrated circuits (ICs). Some embodiments relate to interconnection of ICs using an IC package that includes a glass core.

BACKGROUND

Electronic systems often include integrated circuits (ICs) that are connected to a subassembly such as a substrate of an electronic package that include many ICs. As electronic system designs become more complex, it is a challenge to route the desired interconnection of the ICs of the systems. Additionally, the signals communicated using the routing are becoming higher frequency, which leads to a need for dense routing with high bandwidth and without crosstalk.

BRIEF DESCRIPTION OF THE DRAWINGS

FIGS. 5A-5D is a flow diagram of another method of forming at least one TGV in a substrate in accordance with some embodiments;

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

To meet the demand for increased functional complexity in smaller devices, semiconductor substrate packaging can include glass cores. Glass cores enable transmission of high frequency signals within the package. This is particularly useful in an electronic system that includes central processing unit (CPU) tiles and high-bandwidth memory tiles in a disaggregated CPU architecture. Glass cores also allow improved coplanarity over cores made from organic materials.

Figure 1:
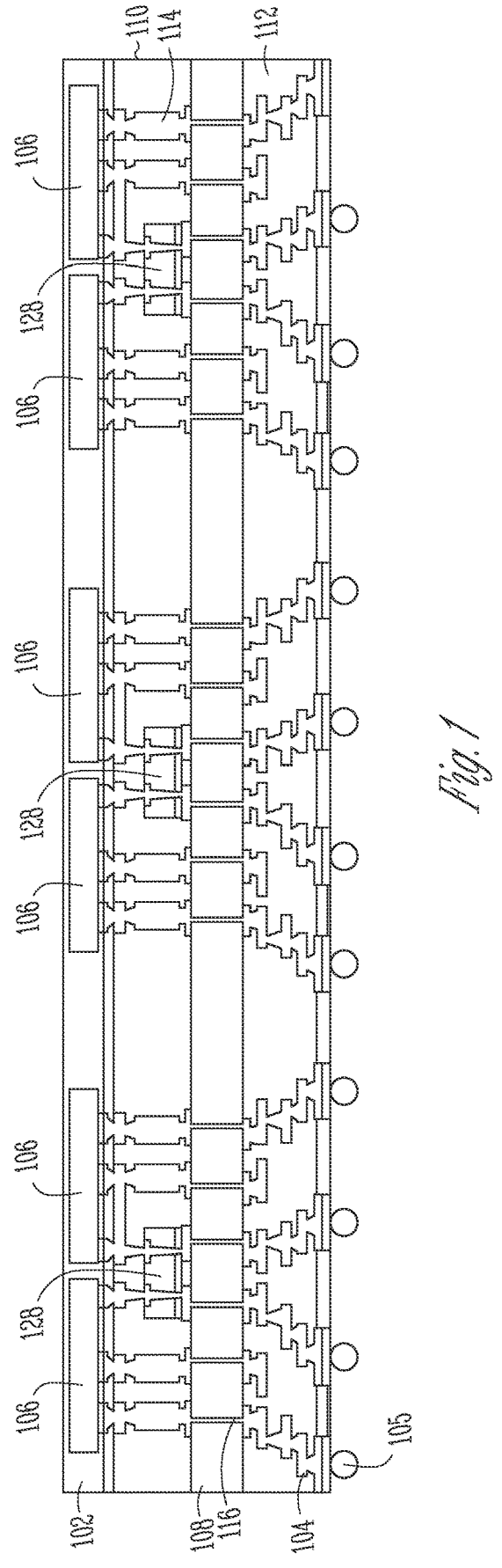
FIG. 1 is an illustration of an integrated circuit (IC) package in accordance with some embodiments.

FIG. 1 is an illustration of an integrated circuit (IC) package for an electronic system. The system includes a top mold layer 102 including multiple IC dice 106. The IC dice 106 can include, among other things, CPU ICs, and memory ICs. The system can include a die-to-die bridge connector 128 such as an Embedded Multi-die Interconnect Bridge (EMIB). The system also includes a glass core 108. Between the glass core 108 and the mold layer 102 is a dielectric layer 110 or redistribution layer. Below the glass core is another dielectric layer 112, or second redistribution layer. The top dielectric layer includes electrically conductive interconnect connected to input-output pads of the IC dice. In the example of FIG. 1, the interconnect includes pillars 114 of conductive material. The interconnect of the dielectric layers is connected to through glass vias (TGVs) 116 of the glass core 108. Electrical signals are communicated among the IC dice of the system using the interconnect. The interconnect of the top dielectric layer 110 is electrically connected to interconnect 104 of the bottom dielectric layer 112 through the glass core using the TGVs 116. The interconnect 104 of the bottom dielectric layer 112 may be connected to solder balls 105 or solder bumps for connecting to a higher level assembly (e.g., a motherboard).

Formation of TGVs is challenging. Metal seeding and subsequent electrolytic plating of titanium or copper through the TGV is difficult due to the high aspect ratio of the TGVs, which can be ten-to-one (10:1) or greater.

Metal deposition by sputtering, as a line-of-sight process, can have very limited seed deposition on the sidewalls of TGV sidewalls. Stage tilting during seed sputter alleviates this problem somewhat, however the typical size of glass core panels (e.g., 510 millimeters (mm)×515 mm) requires a tool with a large chamber that is not currently available in the industry. Electroless copper (Cu) seeding is a standard for through-hole metallization on organic cores, but it's application for glass core would require special pre-treatment which adds additional cost to the process.

FIGS. 2A-2G is a flow diagram of a method 200 of forming at least one electrically conductive through glass via (TGV). The method provides TGV metallization by incorporating a reverse filling architecture. The method can be performed without special tooling.

Figures 2A, 2B, 2C, 2D, 2E, 2F, 2G:
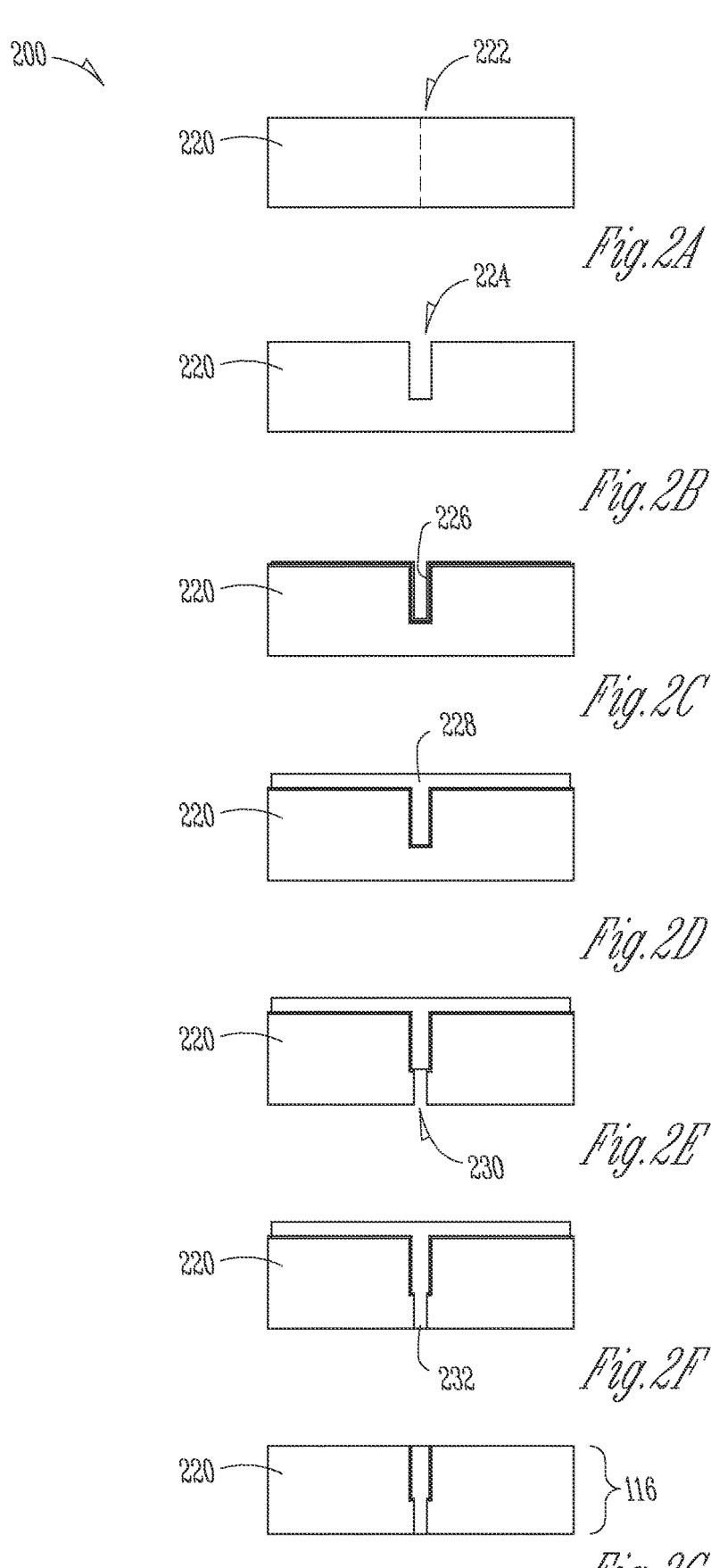
FIGS. 2A-2G is a flow diagram of an example of a method of forming at least one electrically conductive through glass via (TGV) in accordance with some embodiments.

FIG. 2A is an illustration of a substrate 220. The substrate 220 may be a glass substrate made from a silicate-based glass (lithium-silicate, borosilicate, aluminum silicate, etc.). In certain examples, the substrate 220 is a glass substrate made from lower quality glass (e.g., glass made with soda lime), or a glass substrate made from a higher quality glass (e.g., glass made with fused silica). In certain examples, the substrate 220 is a ceramic substrate (e.g., a bulk silicon substrate). One side of the TGV is formed first in the substrate by forming a cavity on one side of the substrate 220. In FIG. 2A, the location of the TGV 222 is lasered to laser activate the location for single-sided anisotropic etching.

In FIG. 2B, the first cavity 224 used for the TGV is opened using single-sided wet etching at the location of the laser activation. It can be seen in the Figure that the TGV is not fully opened but only partially opened from one side.

In FIG. 2C, a layer of seed metallization 226 is disposed on the one side (e.g., the top surface) of the substrate and in the cavity 224. The seed metallization layer 226 may include titanium (Ti), copper (Cu), or aluminum (Al). In certain examples, the seed metallization is a combination of tantalum (Ta), ruthenium (Ru) and copper (Cu). The seed metallization layer 226 can be metal or combination of metals that can be deposited onto a glass panel.

In FIG. 2D, the cavity 224 is filled with electrically conductive material (e.g., metal). The cavity 224 may be filled with metal 228 using a metal plating process. The cavity 224, the seed metallization layer 226 on the sidewalls of the cavity, and the metal 228 form the first portion of the TGV. Because the height (or depth) of the cavity is only about one half the height of the complete TGV, metal filling of the cavity 224 is straightforward. Seeding a large aspect ratio is not required and the sputter process to fill the cavity is simplified.

In FIG. 2E, a second cavity 230 is formed in the substrate 220 from the other side (e.g., bottom surface) of the substrate 220. The second cavity 230 can be formed using single-sided etching on the reverse side. The second etching removes the seed metallization where the two cavities join.

In FIG. 2F, the second cavity 230 is filled with metal 232. Seed metallization is not used in filling the second cavity 230. The cavity 230 may be filled using bottom-up fill without seed metallization. The metal-filled second cavity 230 forms the second portion of the TGV. The metallization of the second cavity is again simplified because the height of the second portion of the TGV is less than the height of the complete TGV. After metallization one or both sides of the substrate 220 may have metal that needs to be removed.

In FIG. 2G, planarization is used to remove the metal from the surfaces and the TGV 116 is shown. The TGV may be connected to the electrically conductive interconnect shown in FIG. 1. In this way, the TGV may be electrically connected to a pad of an IC die as shown in FIG. 1.

Figure 3:
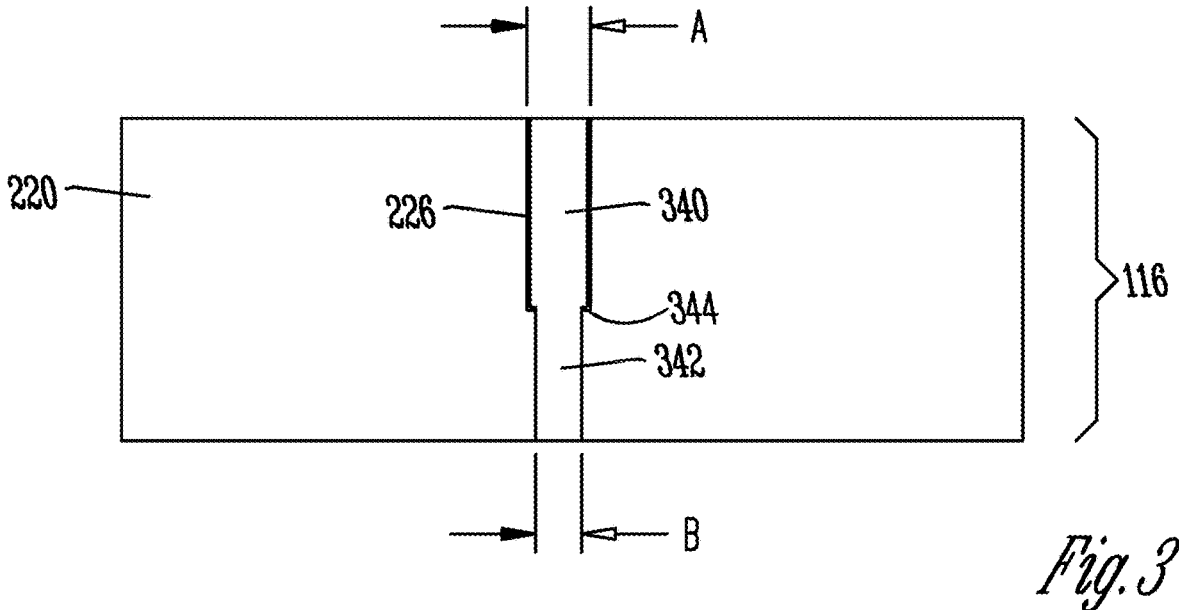
FIG. 3 is an enlarged view of an example of the TGV from FIG. 2G in accordance with some embodiments.

FIG. 3 is an enlarged view of an example of the TGV 116 from FIG. 2G. Because the heights of the two portions of the TGV 116 may differ, the widths or diameters of the two portions of the TGV may differ due to the different depths resulting in different amounts of lateral etching. This difference in depth may occur due to difficulty in precisely controlling the etching. In the TGV 116 of FIG. 3, the height of the top portion 340 is greater than the height of the bottom portion 342. Consequently, the diameter (Diameter A) of the top portion is greater than the diameter (Diameter B) of the bottom portion.

The two portions of the TGV 116 also differ in that the top portion has the seed metallization layer 226 on the sidewall (or sidewalls) and the sidewall of the bottom portion 342 does not have seed metallization on the sidewall. Also, the TGV 116 has a small ridge surface 344 of the seed metallization at the junction of the two portions that remains because it was not removed by the etching to create the bottom portion.

Figure 4:
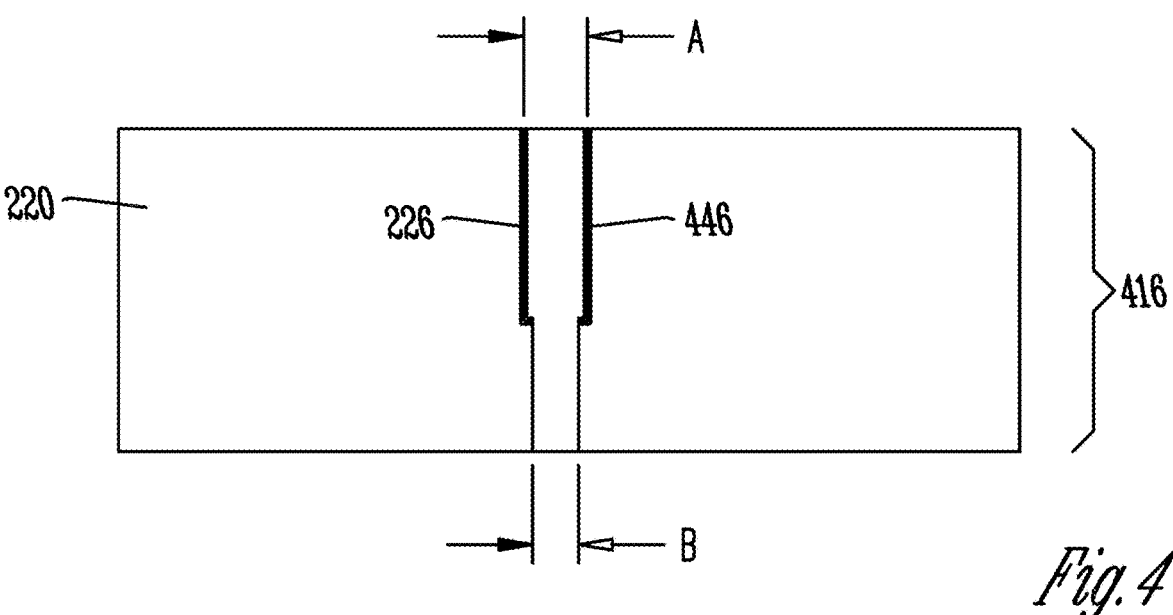
FIG. 4 is another example of a TGV in accordance with some embodiments.

FIG. 4 is an enlarged view of another example of a TGV 416. The TGV 416 is the same as the TGV 116 in FIG. 3 except that there is a layer hydrofluoric acid (HF) etch stop 446 next to the seed metallization layer 226. The HF etch stop may be inserted to prevent interaction of the seed metal with the HF chemistry after etching.

According to some examples, laser activation and etching is not used to form the two cavities that form the complete opening if the TGV in the substrate. According to some examples, blind side drilling is used to form the cavities. In this case, the two portions may have an offset in alignment due to the two different drillings. The center axis of the second portion will be offset from the center axis of the first portion of the TGV.

FIGS. 5A-5D is a flow diagram of another method 500 of forming at least one TGV in a substrate. In FIG. 5A, a blind via is drilled into the substrate 220 to form the first cavity 524 of the TGV. The blind via may be laser drilled into the substrate 220. In FIG. 5B, the first cavity 524 is filled with metal 528 (e.g., using a metal plating process). The first cavity 524 may be filled with seed metallization before being filled with metal.

In FIG. 5C, a second blind via is drilled from the opposite side to create the second cavity 530 of the TGV. In FIG. 5D, the second cavity 530 is filled with metal 532 (e.g., using a metal plating process) to form the TGV 516. The second cavity 530 may or may not be filled with seed metallization before being filled with metal. In some examples, the second cavity is filled with metal using an electroplating process. The filled first cavity may be used as an electrode for the electroplating. Electroplating is desirable because it is fast and can coat deep vias. An electroplated component such as a via is detectably different in metal microstructure when compared to other deposition methods, such as sputtering. For example, a grain structure of the metal may be larger and oriented when compared to sputtering.

FIG. 5D shows metal remaining on the top and bottom surfaces of the substrate 220. This metal is removed as in FIG. 2G (e.g., by planarization). It can be seen in FIG. 5D that the centers of the two portions of the TGV 516 are not aligned.

FIGS. 6A-6G is a flow diagram of another example of a method 600 of forming at least one electrically conductive through glass via (TGV). In this method the opening for the TGV is created at one time (e.g., by etching all the way through the substrate). The method provides TGV metallization by filling the TGV opening with a sacrificial resist thing material. A first portion of the sacrificial material is then removed to create the first cavity which is metallized. The remaining sacrificial material is removed to create the second cavity, which is then metallized to create the TGV. This method also can be performed without special tooling.

Figures 6A, 6B, 6C, 6D, 6E, 6F, 6G:
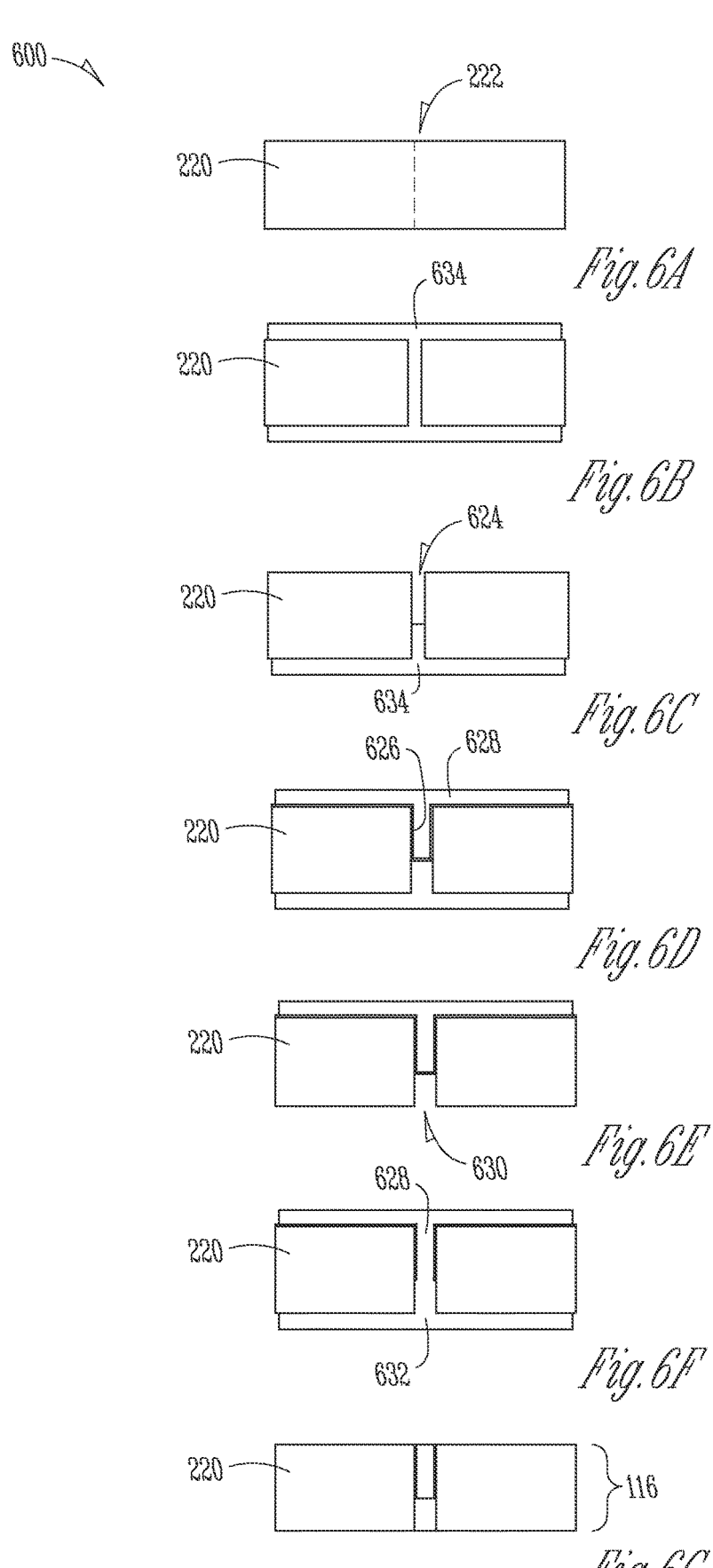
FIGS. 6A-6G is a flow diagram of another example of a method of forming at least one TGV in accordance with some embodiments.

FIG. 6A is an illustration of a substrate 220. The substrate 220 may be any of the example materials described for the substrate in regard to FIG. 2A. In FIG. 2A, the location of the TGV 222 is lasered to laser activate the location for anisotropic etching, and the entire opening for the TGV is formed through the substrate 220. In certain examples, the TGV opening is formed using laser drilling.

In FIG. 6B, the opening is filled with resist thinning material 634. The resist thinning material 634 is also shown on the surfaces of the substrate 220. The resist thinning material 634 may comprise one or both of an acrylic acid group and a phenol group. The resist thinning material 634 may be etched with sodium carbonate or stronger base with pH buffer (to tune the pH) and additives to control diffusion. The resist thinning material 634 can easily flow into the opening for the TGV and provides a highly controllable removal process for the removal of the sacrificial thinning material.

In FIG. 6C, a first cavity 624 is formed in the TGV opening. The cavity 624 may be opened using single sided resist thinning on a first surface (e.g., the top surface) of the TGV. Etching tools may be designed to control a uniform temperature to achieve precise thickness removal. It can be seen in the Figure that the TGV is not fully opened but only partially opened from the top side.

In FIG. 6D, the cavity 624 is filled with electrically conductive material (e.g., metal). The cavity may first be coated with seed metallization as in FIG. 2C to form a seed metallization layer 626 in the cavity 624. The cavity 624 may be filled with metal 628 using a metal plating process. The cavity 624, the seed metallization layer 626 on the sidewalls of the cavity, and the metal 628 form the first portion of the TGV. As in the example of FIG. 2D because the height of the cavity is only about one half the height of the complete TGV, metal filling of the cavity 624 is straightforward. Seeding a large aspect ratio is not required and the sputter process to fill the cavity 624 is simplified.

In FIG. 6E, a second cavity 630 is formed in the TGV opening after filling the first cavity 624. The second cavity 630 is formed in the TGV opening using single side resist thinning on the second surface of the substrate 220. The resist thinning exposes the metal 628 filling the first cavity 624.

In FIG. 6F, the second cavity 630 is filled with the same electrically conductive material as the first cavity 624. The cavity 230 may be filled with metal 632 using bottom-up fill without seed metallization. The metal-filled second cavity 630 forms the second portion of the TGV. The metallization of the second cavity 630 is again simplified because the height of the second portion of the TGV is less than the height of the complete TGV. After metallization one or both sides of the substrate 220 may have metal that needs to be removed.

In FIG. 6G, planarization is used to remove the metal from the surfaces and the TGV 116 is shown. The TGV 116 may be part of the interconnection of an electronic system as shown in FIG. 1.

Figure 7:
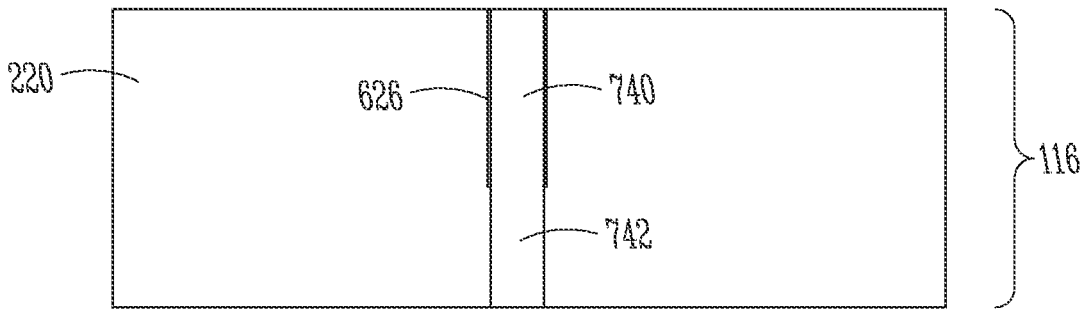
FIG. 7 is another example of a TGV in accordance with some embodiments.

FIG. 7 is an enlarged view of an example of the TGV 116 from FIG. 6G. The heights of the two portions of the TGV 116 may differ due to differing rates of resist thinning. In contrast to the TGV 116 of the example of FIG. 3, the widths or diameters of the two portions is likely to be the same because the opening for the TGV was formed at one time. The two portions of the TGV 116 differ in that the top portion 740 has the seed metallization layer 626 on the sidewall (or sidewalls) and the sidewall of the bottom portion 742 does not have the seed metallization layer 626.

The methods, devices, and systems described herein provide interconnect that can accommodate high frequency signals while providing very dense signal routing. An example of an electronic device using assemblies with system level packaging as described in the present disclosure is included to show an example of a higher level device application.

Figure 8:
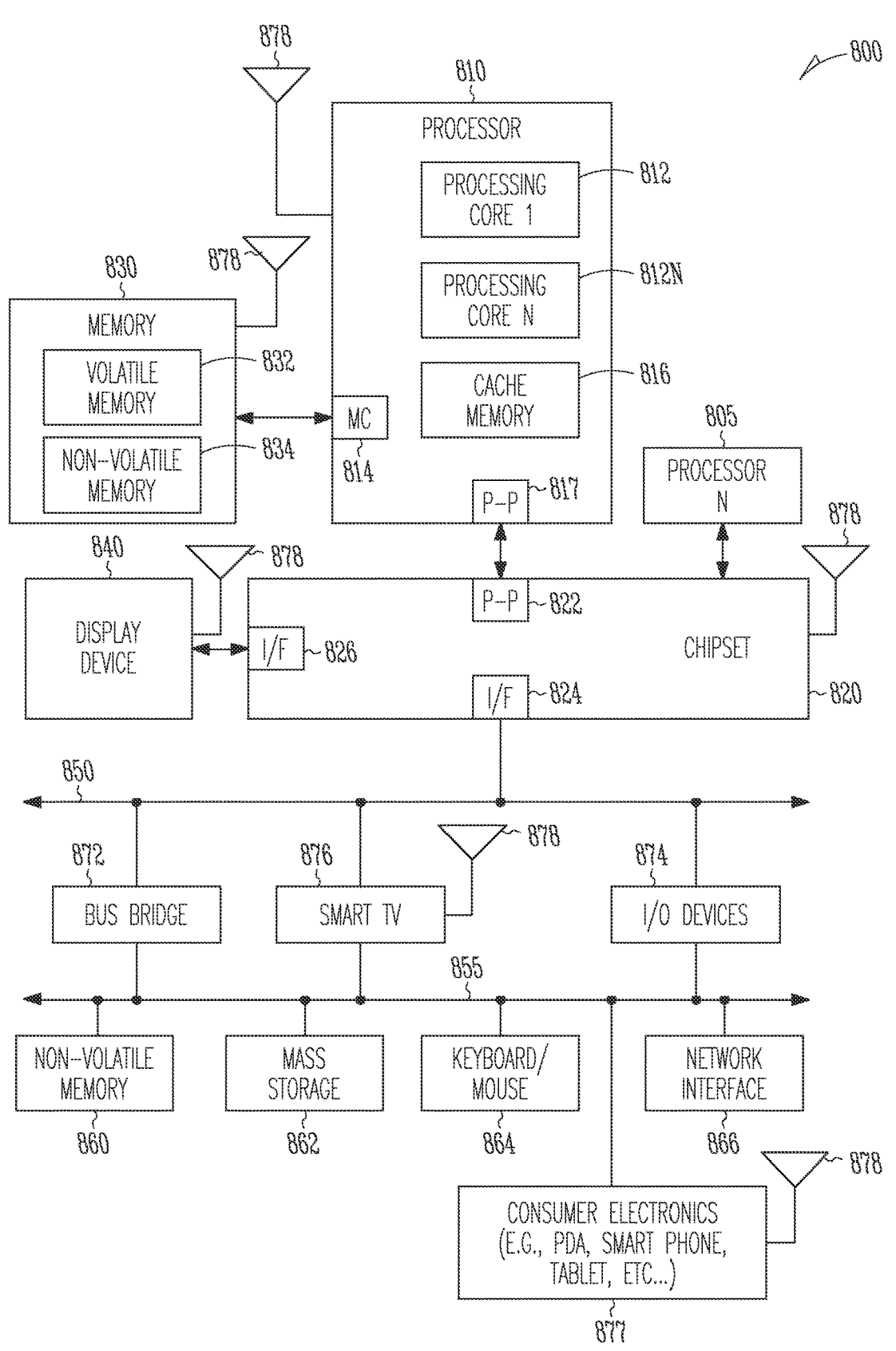
FIG. 8 illustrates a system level diagram in accordance with some embodiments.

FIG. 8 illustrates a system level diagram, according to one embodiment of the invention. For instance, FIG. 8 depicts an example of an electronic device (e.g., system) that can include one or more of the stacked TSVs as described in the present disclosure. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system. In one example, two or more systems as shown in FIG. 8 may be coupled together using one or more stacked TSVs as described in the present disclosure.

In one embodiment, processor 810 has one or more processing cores 812 and 812N, where N is a positive integer and 812N represents the Nth processor core inside processor 810. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, the wireless antenna interface 878 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the invention, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices 872, 876, 874, 860, 862, 864, 866, 877, etc. Buses 850 and 855 may be interconnected together via a bus bridge 872. Chipset 820 connects to one or more buses 850 and 855 that interconnect various elements 874, 860, 862, 864, and 866. Chipset 820 may also be coupled to a wireless antenna 878 to communicate with any device configured to transmit and/or receive wireless signals. Chipset 820 connects to display device 840 via interface (I/F) 826. Display 840 may be, for example, a liquid crystal display (LCD), a plasma display, cathode ray tube (CRT) display, or any other form of visual display device. In some embodiments of the invention, processor 810 and chipset 820 are merged into a single SOC. In one embodiment, chipset 820 couples with (e.g., via interface 824) a non-volatile memory 860, a mass storage medium 862, a keyboard/mouse 864, and a network interface 866 via I/F 824 and/or I/F 826, I/O devices 874, smart TV 876, consumer electronics 877 (e.g., PDA, Smart Phone, Tablet, etc.).

In one embodiment, mass storage medium 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

The devices, systems, and methods described can provide improved routing of interconnection between ICs for a multichip package by providing routing through a glass core using TGVs that are formed without the need for special tooling. Examples described herein include two or three IC dice for simplicity, but one skilled in the art would recognize upon reading this description that the examples can include more than three IC dice.

Additional Description and Examples

Example 1 includes subject matter (such as an electronic device) comprising a glass core. The glass core includes a first surface and a second surface opposite the first surface, at least one through glass via (TGV) extending through the glass core from the first surface to the second surface and including an electrically conductive material. The at least one TGV includes a first portion having a first sidewall and a second portion that includes a second sidewall, wherein the first sidewall includes a material and the second sidewall excludes the material, wherein the material includes at least one of titanium (Ti), copper (Cu), aluminum (Al), tantalum (Ta), or ruthenium (Ru).

In Example 2, the subject matter of Example 1, optionally includes the first sidewall of the TGV having a first sidewall height, and the second sidewall including a second sidewall height different from the first sidewall height.

In Example 3, the subject matter of one or both of Examples 1 and 2 optionally includes the sidewall of the first portion of the TGV having a first height, and the second portion of the TGV having a second height different from the first height.

In Example 4, the subject matter of one or any combination of Examples 1-3 optionally includes a ratio of height of the TGV height to a width of the TGV being greater than ten.

In Example 5, the subject matter of one or any combination of Examples 1-4 optionally includes the glass substrate including silicate glass, and wherein the material comprises a seed material.

In Example 6, the subject matter of one or any combination of Examples 1-5 optionally includes an IC die having a bonding pad, and electrically conductive interconnect. The electrically conductive interconnect electrically connects the bonding pad of the die to a solder bump through the at least one TGV.

Example 7 can include subject matter (such as a method of forming at least one electrically conductive through glass via (TGV) in a glass substrate) or can optionally be combined with one or any combination of Examples 1-6 to include such subject matter, comprising forming a TGV opening in the glass substrate extending from a first surface of the glass substrate to a second surface of the glass substrate, filling the TGV opening with a resist thinning material, forming a first cavity in the TGV opening using single side resist thinning on the first surface, filling the first cavity with an electrically conductive material, forming a second cavity in the TGV opening after filling the first cavity using single side resist thinning on the second surface, and filling the second cavity with the electrically conductive material.

In Example 8, the subject matter of Example 7 optionally includes seed metallization of a sidewall of the first cavity and excluding seed metallization from a sidewall of the second cavity.

In Example 9, the subject matter of one or both of Examples 7 and 8 optionally includes laser activation of a location of the TGV on the glass substrate and anisotropic etching of the location.

In Example 10, the subject matter of one or both of Example 7 and 8 optionally includes laser drilling to form the TGV opening.

In Example 11, the subject matter of one or any combination of Examples 7-10 optionally includes filling the first and second cavities using metal plating, and removing the metal plating from the first surface and second surface of the glass substrate.

In Example 12, the subject matter of one or any combination of Examples 7-11 optionally includes connecting the TGV to a pad of an integrated circuit die using electrically conductive interconnect.

In Example 13, the subject matter of one or any combination of Examples 7-12 optionally includes metal plating at least one of titanium or copper to a silicate glass substrate.

Example 14 can include subject matter (such as an electronic system) or can optionally be combined with one or any combination of Examples 1-13 to include such subject matter, comprising a first mold layer including a first plurality of integrated circuit (IC) dice, a first dielectric layer including electrically conductive interconnect connected to pads of the first plurality of IC dice, a glass core attached to the first dielectric layer, and a second dielectric layer. The glass includes a first surface and a second surface opposite the first surface, and multiple through glass vias (TGVs) extending through the glass core from the first surface to the second surface and including an electrically conductive material. The second dielectric layer includes electrically conductive interconnect connected to the interconnect of the first dielectric layer through the multiple TGVs. The TGVs include a first portion having a first sidewall and a second portion that includes a second sidewall. The first sidewall includes a material and the second sidewall excludes the material, wherein the material includes at least one of titanium (Ti), copper (Cu), aluminum (Al), tantalum (Ta), or ruthenium (Ru).

In Example 15, the subject matter of Example 14 optionally includes the first sidewall of the TGVs having a first sidewall height, and the second sidewall of the TGVs including a second sidewall height different from the first sidewall height.

In Example 16, the subject matter of Example 14 optionally includes the first sidewall of the first portion of the TGVs having a first height, and the second portion of the TGVs having a second height different from the first height.

In Example 17, the subject matter of one or any combination of Examples 14-16 optionally includes a ratio of height of the TGVs to a width of the TGVs being greater than ten.

In Example 18, the subject matter of one or any combination of Examples 14-17 optionally includes the glass substrate including silicate glass, and wherein the material comprises a seed material.

In Example 19, the subject matter of one or any combination of Examples 14-18 optionally includes electrically conductive interconnect. The IC dice include bonding pads, and the electrically conductive interconnect electrically connects one or more bonding pads of the IC dice to one or more solder bumps through at least one TGV.

In Example 20, the subject matter of one Example 19 optionally includes the second dielectric layer including electrically conductive interconnect connected to the one or more solder bumps, and at least a portion of the bonding pads of the IC dice are connected to the one or more solder bumps using the interconnect of the first dielectric layer, the interconnect of the second dielectric layer, and the multiple TGVs.

These non-limiting examples can be combined in any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An electronic device comprising:

a glass core including a first surface and a second surface opposite the first surface; and at least one through glass via (TGV) extending through the glass core from the first surface to the second surface and including an electrically conductive fill metal, wherein:

the at least one TGV includes a first portion having a first sidewall and a second portion having a second sidewall;

the first sidewall includes a material between the fill metal and the glass core and the second sidewall excludes the material with the fill metal in direct contact with the glass core;

the material includes at least one of titanium (Ti), aluminum (Al), tantalum (Ta), or ruthenium (Ru); and a center axis of the second portion is laterally offset from the center axis of the first portion.

2. The electronic device of claim 1, wherein the first sidewall includes a first sidewall height, and the second sidewall includes a second sidewall height different from the first sidewall height.

3. The electronic device of claim 1, wherein the first portion has a first diameter and the second portion has a second diameter, smaller than the first diameter, and wherein there is a ridge where the first diameter transitions to the second diameter.

4. The electronic device of claim 3, wherein the difference between the first and second diameters is greater than twice a total thickness of the material along the first sidewall.

5. The electronic device of claim 1, wherein the glass core includes silicate glass, and wherein the material comprises a seed material.

6. The electronic device of claim 1, including:

a first integrated circuit (IC) die having a bonding pad;

an electrically conductive interconnect; and wherein the electrically conductive interconnect electrically connects the bonding pad of the IC die to a solder bump through the at least one TGV.

7. An electronic system comprising:

a first mold layer including a first plurality of integrated circuit (IC) dice;

a first dielectric layer including electrically conductive interconnect connected to pads of the first plurality of IC dice; and the electronic device of claim 1, wherein the glass core is attached to the first dielectric layer and a second dielectric layer including an electrically conductive interconnect connected to the interconnect of the first dielectric layer through the at least one TGV.

8. The electronic system of claim 7, wherein a ratio of height of the at least one TGV to a width of the at least one TGV is greater than ten.

9. The electronic system of claim 8, wherein the glass substrate includes silicate glass, and wherein the material comprises a seed material.

10. The electronic system of claim 7, including:

electrically conductive interconnect; and wherein the IC dice include bonding pads, and the electrically conductive interconnect electrically connects one or more bonding pads of the IC dice to one or more solder bumps through the at least one TGV.

11. The electronic system of claim 10, wherein the second dielectric layer includes electrically conductive interconnect connected to the one or more solder bumps, and at least a portion of the bonding pads of the IC dice are connected to the one or more solder bumps using the interconnect of the first dielectric layer, the interconnect of the second dielectric layer, and the at least one TGV.

12. The electronic device of claim 1, wherein the first sidewall further comprises an hydrofluoric acid (HF) etch stop layer between the material and the glass core.

* * * * *